(12) United States Patent  
Nishiyama et al.

(10) Patent No.: US 6,936,525 B2  
(45) Date of Patent: Aug. 30, 2005

(54) CHIP-LIKE ELECTRONIC COMPONENTS, A METHOD OF MANUFACTURING THE SAME, A PSEUDO WAFER THEREFOR AND A METHOD OF MANUFACTURING THEREOF

(75) Inventors: Kazuo Nishiyama, Kanagawa (JP); Hiroshi Ozaki, Saitama (JP); Yuji Takaoka, Kanagawa (JP); Teruo Hirayama, Kanagawa (JP)

(73) Assignee: Sony Corporation, Tokyo (JP)

( * ) Notice: Subject to any disclaimer, the term of this patent is extended or adjusted under 35 U.S.C. 154(b) by 7 days.

(21) Appl. No.: 10/236,771

(22) Filed: Sep. 6, 2002

(65) Prior Publication Data

US 2003/0092252 A1 May 15, 2003

Related U.S. Application Data

(62) Division of application No. 09/841,582, filed on Apr. 24, 2001.

(30) Foreign Application Priority Data

Apr. 24, 2000 (JP) ........................ P2000-122112

(51) Int. Cl.$^7$ .................. H01L 21/46; H01L 21/78; H01L 21/301
(52) U.S. Cl. .................. 438/464; 438/64; 438/460
(58) Field of Search ................ 438/26, 33, 64, 438/68, 460, 463, 464, 963

(56) References Cited

U.S. PATENT DOCUMENTS

| | | |
|---|---|---|
| 4,931,853 A | 6/1990 | Ohuchi et al. |
| 5,032,543 A | 7/1991 | Black et al. |
| 5,600,181 A | 2/1997 | Scott et al. |
| 5,786,628 A | 7/1998 | Beilstein, Jr. et al. |
| 5,796,164 A | 8/1998 | McGraw et al. |
| 5,874,774 A | 2/1999 | Takahashi |
| 5,942,578 A * | 8/1999 | Noguchi et al. ............ 525/228 |
| 5,956,236 A | 9/1999 | Corisis et al. |
| 5,989,982 A | 11/1999 | Yoshikazu et al. |
| 6,104,089 A | 8/2000 | Akram |
| 6,174,751 B1 | 1/2001 | Oka |
| 6,242,283 B1 | 6/2001 | Lo et al. |
| 6,291,884 B1 | 9/2001 | Glenn et al. |
| 6,344,401 B1 | 2/2002 | Lam |
| 6,348,728 B1 | 2/2002 | Aiba et al. |
| 6,373,133 B1 | 4/2002 | DiGiacomo et al. |
| 6,445,591 B1 | 9/2002 | Kwong |
| 6,518,662 B1 * | 2/2003 | Smith et al. ................ 257/724 |
| 6,555,906 B2 | 4/2003 | Towle et al. |
| 2001/0018229 A1 | 8/2001 | Kato et al. |
| 2001/0039078 A1 | 11/2001 | Schroen |

FOREIGN PATENT DOCUMENTS

| | | |
|---|---|---|
| EP | 0611129 | 8/1994 |
| FR | 2572849 | 9/1986 |
| JP | 05-055278 | 5/1993 |
| JP | 05-090559 | 9/1993 |
| JP | 06-163808 | 10/1994 |
| JP | 2001-110828 | 4/2001 |

* cited by examiner

Primary Examiner—Asok Kumar Sarkar
(74) Attorney, Agent, or Firm—Robert J. Depke; Trexler, Bushnell, Giangiorgi, Blackstone & Marr

(57) ABSTRACT

A method of manufacturing the semiconductor chips comprises the steps of: pasting on a substrate an adhesive sheet having a property to retain its adhesive strength prior to a processing, then lose its adhesive strength after the processing; fixing a plurality of non-defective bare chips on this adhesive sheet, with their Al electrode pad surfaces facing down; coating a resin on a whole area other than the Al electrode pad surfaces of the plurality of non-defective bare chips including interspaces therebetween; applying a predetermined process to the adhesive sheet to weaken its adhesive strength of the adhesive sheet; peeling off a pseudo wafer bonding non-defective bare chips; and dicing the plurality of non-defective bare chips into a discrete non-defective electronic part by cutting the pseudo wafer at a position of the resin between respective non-defective bare chips.

11 Claims, 19 Drawing Sheets

ULTRAVIOLET RAYS

ULTRAVIOLET RAYS

ELECTRODE

CHIP-LIKE ELECTRONIC COMPONENTS, A METHOD OF MANUFACTURING THE SAME, A PSEUDO WAFER THEREFOR AND A METHOD OF MANUFACTURING THEREOF

RELATED APPLICATION DATA

The present application is a divisional of U.S. application Ser. No. 09/841,582 filed Apr. 24, 2001, which claims priority to Japanese P2000-122112 filed Apr.24, 2000. The present application claims priority to each of these previously filed applications.

BACKGROUND OF THE INVENTION

The present invention relates to a chip-like electronic component suitable for use in the manufacture of a semiconductor device and a method of manufacturing the same, and in particular, it relates to a pseudo wafer for use in the manufacture of the same and a method therefor.

Recently, demands for a more compact, thinner and lightweight design of a portable electronic device which is typically represented by a digital video camera, a digital portable telephone, a note-size personal computer and the like are growing, thereby it is becoming a most important key point how to improve a surface packaging density on their semiconductor parts. For this purpose, a development of a more compact CSP (Chip Scale Package) in place of package ICs (QFP (Quad flat package) or the like) and a proliferation of a bare chip packaging based on the flip chip method which is now partially adopted and may lead to an ultimate semiconductor high density packaging technology are strongly desired.

By way of example, as a typical bump forming technique in the above-mentioned flip chip packaging method, there are a method for forming Au bumps on an Al electrode pad by using the Au-stud bump method or the electroplating method, and a method for forming solder bumps in batch by using the electroplating method or the vapor deposition method. However, in a commercial application where a low cost flip chip packaging is preferred, it is advantageous not to form bumps after the chip is prepared as in the Au stud bump method, but to form bumps in batch in its preceding stage of wafer.

This wafer batch processing method described above clearly indicates a trend of technology in the future in consideration of a recent advancement of large scaled wafers (from 150 mm$\phi$ to 200 mm$\phi$ and to 300 mm$\phi$), and an increasing number of chip connection pins in LSIs (large scaled integrated-circuits).

Conventional bump forming methods will be described in the following.

FIG. 9 is an example showing an Au stud bump 24. On a surface of an Al pad 55 formed on a semiconductor chip 25 which is diced from a wafer there is formed the Au stud bump 24 using a wire bonding method. FIG. 10 shows an example in which a silicon substrate (wafer) 51 having, for example, an input/output circuit 22 and a device region (memory) 23 formed thereon, is processed in batch so as to form solder bumps 62 in its wafer level. By way of example, reference numeral 21 depicts a scribe line.

Further, FIGS. 11A–11E show steps of forming bumps on a wafer in batch in combination of Ni electroless plating and solder paste printing methods in order to reduce the cost of manufacture. FIG. 11A depicts a silicon substrate (wafer) having an SiO$_2$ film formed thereon, and FIG. 11B depicts an enlarged part of a chip portion including its electrodes. In FIGS. 11A and 11B, numeral 51 depicts an Si substrate (wafer), 55 depicts an Al electrode pad, and others depict a SiO$_2$ film and a passivation film comprising Si$_3$N$_4$ film, SiO$_2$ film or a polyimide film.

In FIG. 11C, exclusively on a perforated upper surface of the Al electrode pad 55, an Ni electroless plating layer (UBM: under bump metal) is formed selectively by the Ni electroless plating method. This Ni electroless plating layer serving as a UBM for supporting electric connection between the Al electrode pad 55 and the solder bump can be formed easily by the steps of pretreating the Al electrode pad 55 with a phosphoric acid etching solution, substitution-precipitating Zn by a Zn processing, and dip-coating in a Ni—P plating vessel.

FIG. 11D shows a state in which a solder paste 59 is transferred onto the Ni electroless plating layer (UBM) through a metal screen mask 52 by a printing method. FIG. 11E shows a state in which the solder paste 59 is fused by a wet back method (hot fusing) to form a solder bump 62. Thereby, without use of a photo processing, the solder bump 62 can be formed easily by using the Ni electroless plating method and the solder paste screen printing method, or the like.

On the other hand, the CSP which is an approach to a high density packaging of LSIs by minimizing respective chips thereof is comprised of several common circuit blocks as viewed from the standpoint of a digital device circuit block diagram, and there is emerging such a process to provide these common circuit blocks in a multi package or in a MCM (multi chip module). Provision of SRAM (static RAM), flash memory and a microcomputer in one chip package in a digital portable telephone is one example thereof.

This MCM technology is expected to show a significant advantage also in a one-chip system LSI of a recent development. Namely, when integrating memory, logic and analog LSIs on one chip, different LSI fabrication processes must be handled in a same wafer processing step, thereby substantially increasing the number of masks and processing steps, and its TAT (turnaround time) for development being prolonged. Also, a low yield in production resulting from the increased steps of processing is a serious problem which cannot be ignored.

For this reason, it is considered to be promising that respective LSIs are fabricated discretely, then they are packaged in an MCM. An example of such MCM packaging is shown in FIGS. 12A and 12B.

FIGS. 12A and 12B show a wire-bonding method whereby each chip 62 mounted on a circuit substrate 60 is electrically connected using a wire 61 therebetween. Further, FIGS. 13A–13C show a flip chip method whereby each chip 64 is connected to an electrode 63 on a circuit substrate 60 in a state of facedown. For the purpose of a more compact and thinner design of the device, the flip chip method indicated in FIGS. 13A–13C is considered to be advantageous. Further, for minimization of connecting wire length necessary for a faster speed in the future, and in consideration of impedance variations in respective connections, the flip chip method is considered to take over.

For the MCM using the flip chip method, there are proposed various connecting methods including such one that forms Au-stud bumps on a surface of an Al electrode pad 55 provided on each LSI of a plurality of different types of LSIs, and electrically connects with its circuit substrate via an anisotropic conductive film (ACF), another method by a press bonding using a resin paste, and other ones that use plated Au bumps, Ni electroless plated bumps, soldered bumps or the like as its bumps. FIG. 13C shows an example which ensures a lower electric resistance connection to the substrate 60 by means of an intercalation bonding via a solder bump 65.

The above-mentioned respective bump-forming methods have been completed already and started to be used for mass production. For example, the Au stud bump 24 indicated in FIG. 9 is formed by a method of forming a bump per chip. This method of forming a bump per chip is widely used as a simple bump forming method using existing facilities, however, there is a problem that as the number of termination pins increases, the cost of forming bumps will increase accordingly.

Further, in a recent trend of a lower voltage driving of LSIs, because of a problem of a voltage drop in an Al wiring layer, a provision of an area pad not limiting to a peripheral electrode pad but including additional electrode pads also on active elements is required. However, the Au stud bump 24 in FIG. 9 is not suitable for use as this area pad in consideration of a bonding load and a susceptibility to damage. Still further, there is such a problem that a packaging of Au stud bump chips is done by press bonding of a piece by piece basis, and has a difficulty of mounting on both surfaces.

On the other hand, the wafer batch solder bump forming method is advantageous in terms of packaging because it can be applied to the provision of the area pad, and enables a batch reflow or a double side mounting. However, it has a disadvantage when applying to the processing of a leading-edge wafer which normally has a low yield of production because a cost of production per non-defective chip will substantially increase.

Namely, with reference to FIG. 14, which indicates a semiconductor wafer 53 fabricated by a conventional wafer batch processing, nevertheless a high yield of production is required for the leading-edge LSIs, the number of defective chips 20 partitioned by a scribe line 21 and marked with "x" is actually greater than the number of non-defective chips 3 marked with "o".

Further, there has been such a problem that if bare chips are purchased from external manufacturers or venders, it is extremely difficult to form bumps on them due to a varied design specification. Namely, although the above-mentioned two types of bump forming methods have their own merits, they cannot be used in all fields, but are actually used individually taking the most use of their own merits. The wafer batch bump forming method which has a high yield is advantageous for use in such a case where the number of terminals accommodated within a single wafer is large (for example, 50000 terminals/wafer), or for forming low damage bumps applicable to the area pad. Further, the Au stud bump is advantageous for use in a bump treatment per chip in a case where the bare chips are purchased by lot, or for a simple bump treatment.

Still further, when the semiconductor wafer 53 indicated in FIG. 14 is diced along the scribe line 21, a damage such as a stress or a crack occurs in the chip due to its dicing, which may lead to a failure. Furthermore, if a process of forming solder bumps in batch on the semiconductor wafer 53 which includes both the non-defective chips 3 and the defective chips 20 is allowed to proceed, the process applied to the defective chips 20 is wasted, thereby increasing the cost of manufacture.

In Japanese Patent Application Publication Laid-Open Hei 9-260581, a method of forming a wiring layer for interconnection between devices is disclosed whereby a plurality of semiconductor chips are firmly bonded on a silicon wafer, embedded into a resin formed on a substrate made of alumina or the like under pressure, then peeled off so as to provide a flat wafer surface and form the wiring layer for interconnection between the devices on this flat wafer surface by photolithography.

According to this conventional method, it is proposed that a wafer batch processing becomes possible and a low cost manufacture thereof by a merit of mass production is attained. However, because there exists a hard substrate made of alumina described above under the bottom surface of each semiconductor chip arrayed on the wafer, at the time of scribing and cutting into a dice, the hard substrate present under the bottom surface of the chip must be cut together with the resin between adjacent chips, thereby likely to damage a cutter blade. In addition, although the sidewalls of the chip are covered with the resin, there exists only the hard substrate different from the resin on the bottom surface thereof, therefore, there is such a problem that the bottom surface of the chip is not protected effectively and adhesion therebetween is weak.

SUMMARY OF THE INVENTION

The present invention is contemplated to solve the above-mentioned problems associated with the conventional art, and to provide a chip-like electronic component such as a semiconductor chip which is comprised of leading-edge LSIs or bare chips even if they are purchased from outside, and can be mass-produced at a high yield, low cost and high reliability.

The present invention is directed to chip-like electronic components such as semiconductor chips, wherein each of them has at least its electrodes formed exclusively on one surface thereof, all the rest of its surfaces without the electrodes are covered continuously with a protective substance and a pseudo wafer, which is comprised of a plurality and/or a plurality of different types chip-like electronic components bonded spaced apart from each other by the protective substance which is coated continuously therebetween and on their bottom surfaces.

According to another aspect of the invention, a method of manufacturing of the pseudo wafer is provided, which is comprised of the steps of: pasting an adhesive material on a substrate, retaining an adhesive strength prior to its processing and losing the adhesive strength post its processing; fixing a plurality and/or a plurality of different types of semiconductor chips on this adhesive material with their surfaces having electrodes facing downward; coating a protective material on a whole portion of the rest of the surfaces of the plurality and/or the plurality of different types of semiconductor chips including interspatial gaps therebetween; applying a predetermined processing to the adhesive material so as to lower the adhesive strength thereof; and peeling off the pseudo wafer having these semiconductor chips fixed thereon. In addition, a method of manufacturing of a chip-like electronic component is provided, which is comprised of the step of cutting off the protective material between respective semiconductor chips of the plurality and/or the plurality of different types of semiconductor chips on the wafer so as to separate and provide a discrete semiconductor chip or a chip-like electronic component.

According to the present invention, because the portions of the chip-like electronic component such as the semiconductor chip or the like (hereinafter explained with reference to the semiconductor chip) other than its surface provided with electrodes, namely, the side wall and the bottom surface of the chip, are protected continuously with a protective material, the chip is ensured to be protected in its post chip handling, thereby facilitating its handling and enabling an excellent package reliability to be obtained.

Further, by pasting on a substrate solely and only non-defective chips which are diced from a semiconductor wafer and selected, coating them wholly with the protective material, then peeling from the substrate, a pseudo wafer is obtained as if comprising completely of non-defective chips. Therefore, a wafer batch bump treatment for these non-defective chips becomes possible, thereby allowing to form bump chips at a lower cost, and when dicing respective semiconductor chips from the pseudo wafer, the portion of the protective material, which is easy to cut, between adjacent chips is cut along the scribe line without causing any adverse effect (such as strain, burr, crack and the like) to occur on each semiconductor chip itself. In addition, because the sidewall and the bottom surface of the chip are coated with the protective material such as a passivation film, an Ni electroless plating process can be applied as well. Further, not only wafers of in-house product but also bare chips purchased from the other manufacturers are allowed to be subjected to the solder bump treatment likewise and easily. By way of example, it is becoming a rare case that all of a plurality of different types of LSI chips to be packaged in an MCM are supplied from a same semiconductor manufacturer because of an increasing burden for investing on several leading edge semiconductor production lines simultaneously. Therefore, by opting not to purchase a whole bunch of chips of SRAMs, flash memories, microcomputers or even central processor units (CPUs) from the same semiconductor manufacturer, but to purchase them separately from different chip manufacturers who are most specialized in any one of these leading-edge technologies, they can be assembled in an MCM according to the invention. In addition, the substrate described above can be used in repetition advantageously in terms of cost reduction of bump forming as well as environmentally.

Conclusively, there are such advantages and effects according to the present invention that because of the provision of the method of manufacturing the chip-like electronic components, comprising the steps of: pasting on the substrate the adhesive material having the property to retain its adhesive strength prior to its processing and to lose its adhesive strength after its processing; fixing on this substrate the plurality and/or the plurality of different types of semiconductor chips with their electrode surfaces facing down; coating the whole area of the semiconductor chips including the interspatial gaps therebetween with the protective material; applying the predetermined processing to the adhesive material to lose its adhesive strength; peeling off the pseudo wafer having the semiconductor chips which are bonded at their side walls and their bottom surfaces with the protective material; and dicing the plurality of semiconductor chips from the pseudo wafer as required into a discrete semiconductor chip or a chip-like electronic component by cutting the protective material at the position between the plurality of semiconductor chips, thereby the adverse effects such as strain, flash, crack damages or the like on the chip-like electronic components due to dicing can be suppressed. Further, there is another merit that by dicing only the non-defective chip-like electronic components from the pseudo wafer and rearranging them on the package substrate, we can obtain the wafer as if having solely and only the non-defective chips, thereby enabling the wafer batch solder bump processing to be realized, allowing for the flip-chip solder bump chips to be formed at a low cost. Further, there is still another advantage that notwithstanding whether the bare chips are purchased from the other manufacturer or manufactured in-house, easy and efficient solder bump processing becomes possible. Furthermore, because the side walls and bottom surfaces of respective chips are covered with and protected by the protective material, Ni electroless plating processing becomes possible, and also an excellent packaging reliability is ensured to be maintained in the subsequent package handling of the diced chips.

PREFERRED EMBODIMENTS OF THE INVENTION

Figure 1A:
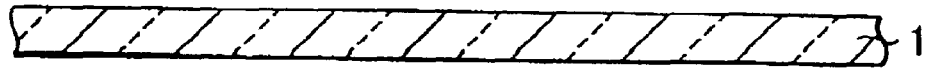
FIGS. 1A–1K are cross-sectional views showing a flow of steps of manufacture of a semiconductor chip according to a first embodiment of the invention.

According to the present invention, the above-mentioned protective material is an organic insulating resin or an inorganic insulating material. The semiconductor chip of the invention which is diced at the position of the protective material between respective semiconductor chips and mounted on a packaging substrate may be a single or a plurality of chips, or a plurality of different types of chips which are integrated by means of the protective material, wherein the above-mentioned electrodes are provided on the packaging surface thereof while the side wall and the bottom surface thereof are covered with the above-mentioned protective material, and preferably solder bumps are formed on the above-mentioned electrodes.

Preferably, a single semiconductor chip or an integrated semiconductor chip integrating a plurality of them or a plurality of different types of them to be mounted on a packaging substrate are obtained according to the invention by the method, comprising the steps of: pasting an adhesive sheet on a flat surface of a transparent substrate or the like; fixing a plurality of non-defective (conforming) semiconductor chips or a plurality of different types of them on this adhesive sheet, with the surfaces thereof having the electrodes facing down; uniformly coating the semiconductor chips from their bottom surfaces with the protective material which is the organic insulating resin or inorganic insulating material and subsequently hardening the same; then irradiating with ultraviolet rays from the bottom of the transparent substrate opposite to its surface on which the semiconductor chips are fixed, or applying a chemical solution or heating so as to weaken the adhesive strength of the above-mentioned adhesive sheet; peeling off from the substrate a pseudo wafer having the plurality of semiconductor chips and/or the plurality of different types of them bonded thereon with the protective material; thereby obtaining the pseudo wafer which has a plurality of solely non-defective (conforming) semiconductor chips or a plurality of different types thereof arrayed thereon, and the surface thereof having the electrodes exposed; dicing this pseudo wafer by cutting along the scribe line at the position of the protective material between the plurality of semiconductor chips and/or the plurality of different types thereof; and acquiring discrete semiconductor chips and/or integrated semiconductor chips integrating a plurality of semiconductor chips or a plurality of different types thereof ready to be mounted on the packaging substrate.

Further, the non-defective semiconductor chips or chip-like electronic components may be selected in such a manner that solely and only the semiconductor chips which are judged to be non-defective by characteristics measurements are allowed to be bonded on the above-mentioned substrate, or that they are subjected to the characteristics measurements in a state as bonded with the above-mentioned protective material and then only the non-defective semiconductor chips or chip-like electronic components are selected.

Preferred embodiments of the invention will be described more specifically in the following with reference to the accompanying drawings.

Figure 3:
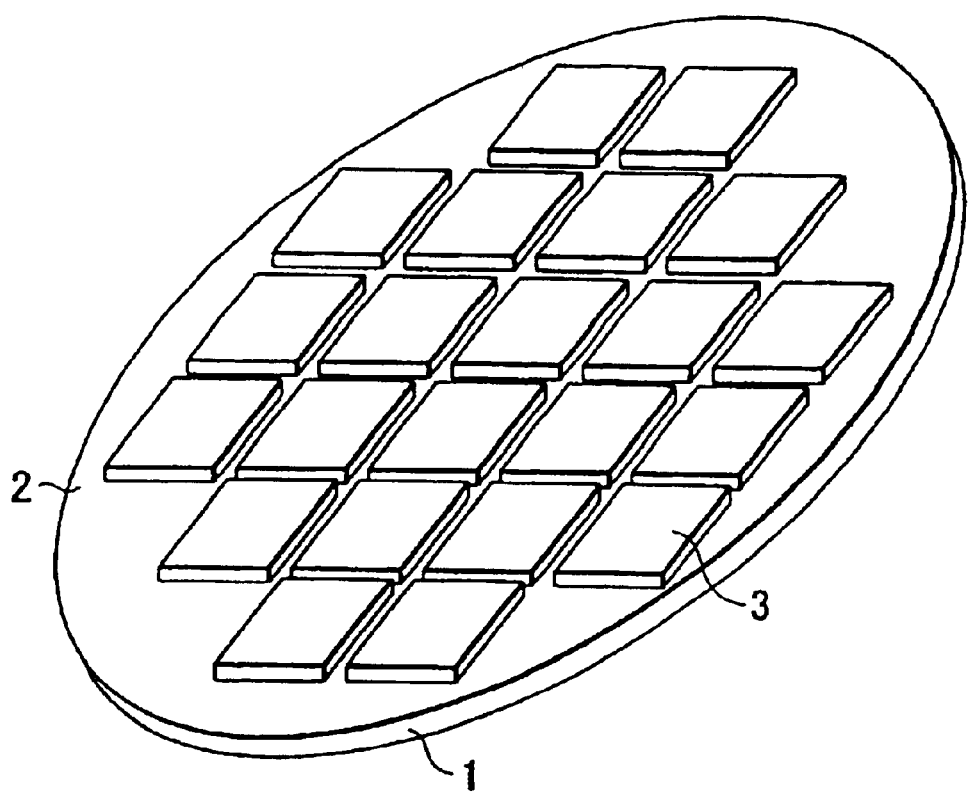
FIG. 3 is a perspective view of a quartz substrate having solely and only non-defective (conforming) bare chips pasted thereon.
Figure 4:
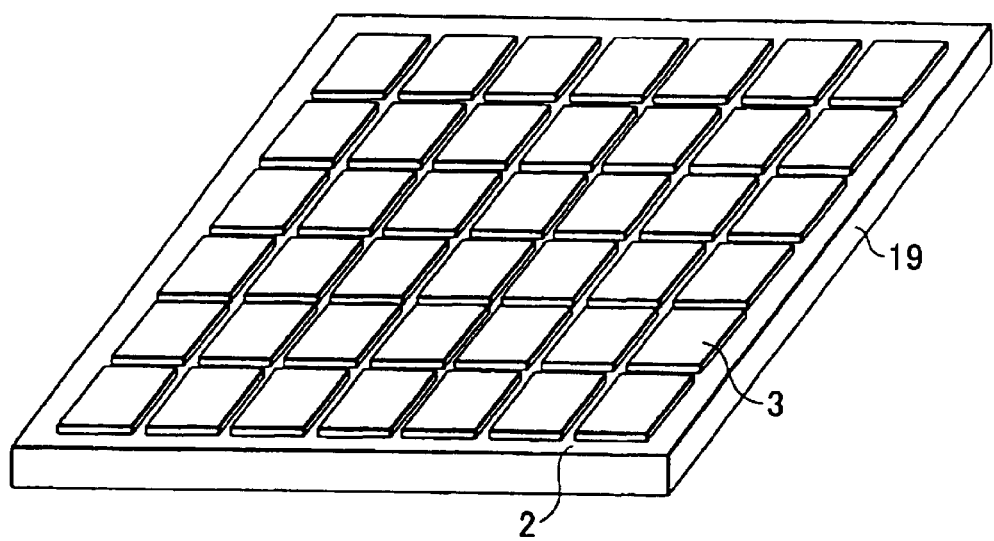
FIG. 4 is a perspective view of a large-sized glass substrate of the same on which only non-defective bare chips are pasted.
Figure 14:
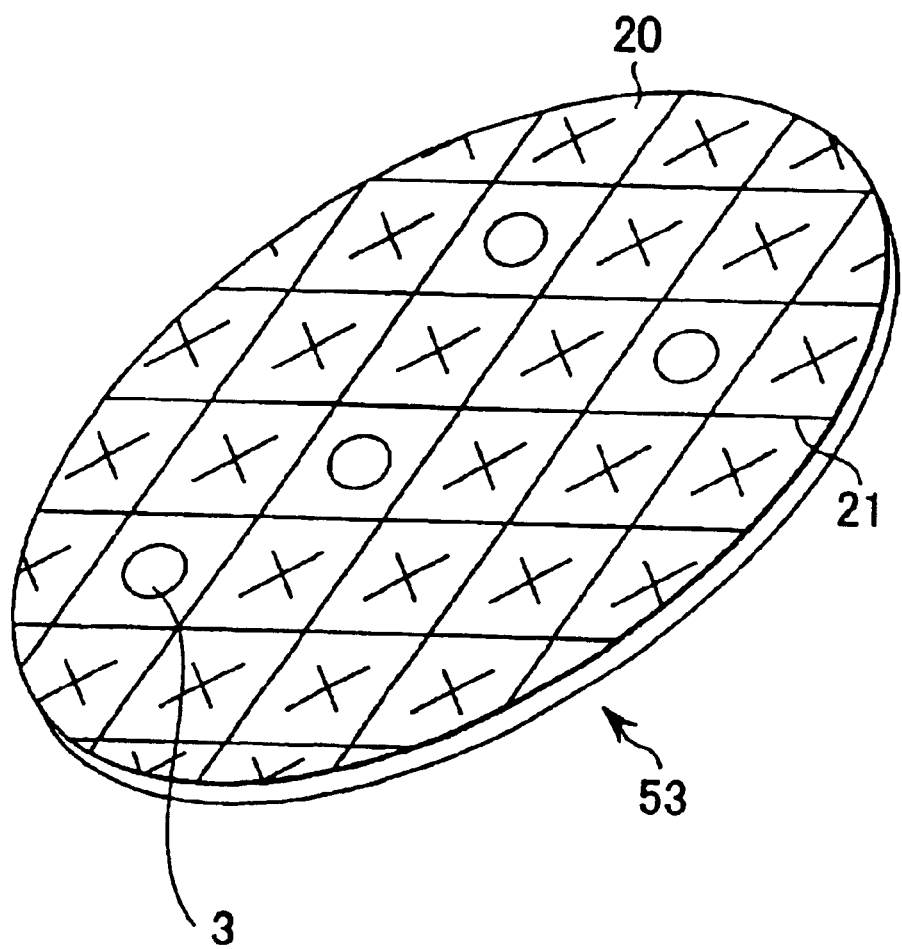
FIG. 14 is a perspective view of a semiconductor wafer corresponding to the wafer batch processing.

Embodiment 1:

FIG. 3 shows an example of intermediate wafers having only non-defective semiconductor bare chips 3 (or LSI chips) that are diced from the semiconductor wafer 53 indicated in FIG. 14, verified to be conforming to its specification in an open/shorted or DC voltage measurements, then arranged at an equidistance from each other and pasted on a circular quartz substrate 1 via an adhesive sheet 2 made of acrylic or the like. Further, FIG. 4 shows another example thereof wherein a large-sized square glass substrate 19 is used instead of the circular quartz substrate 1 in order to allow for a greater number of non-defective chips 3 to be pasted on a relatively limited area via the adhesive sheet 2, thereby ensuring an improved cost merit to be attained in the subsequent processing.

A method of forming solder bumps in batch using the quartz substrate 1 of FIG. 3 on which only the non-defective chips are pasted will be described in the following with reference to FIGS. 1A–1K.

FIG. 1A shows a quartz substrate 1 serving as a temporary support substrate. However, because a heat process to be applied to this substrate is below 400° C., a less costly glass substrate may be used. Further, this quartz substrate 1 can be used in repetition.

Figure 1B:
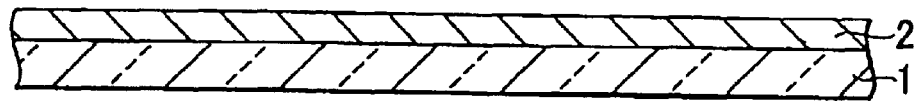

In the next step of FIG. 1B, an adhesive sheet 2 made of such as acrylic which is used in a normal dicing and loses its adhesive strength when irradiated with ultraviolet rays is pasted on the quartz substrate 1.

Figure 1C:
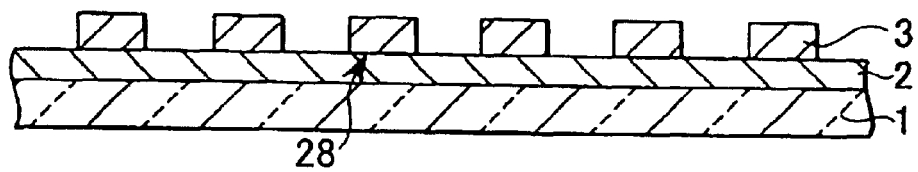

In the next step as shown in FIG. 1C, a plurality of non-defective bare chips 3 verified to be conforming as described above are arrayed and pasted on the adhesive sheet 2 with their chip surfaces (device surfaces) 28 facing down. By way of example, these non-defective bare chips 3 may be selected from a dicing sheet (not shown) which was subjected to dicing in a wafer process and in an extended state, or may be transferred from a chip tray. What is important and to be noted here is that notwithstanding whether they are manufactured in-house or by other manufacturers, totally and only the non-defective bare chips 3 are allowed to be rearranged on the substrate 1.

Figure 1D:
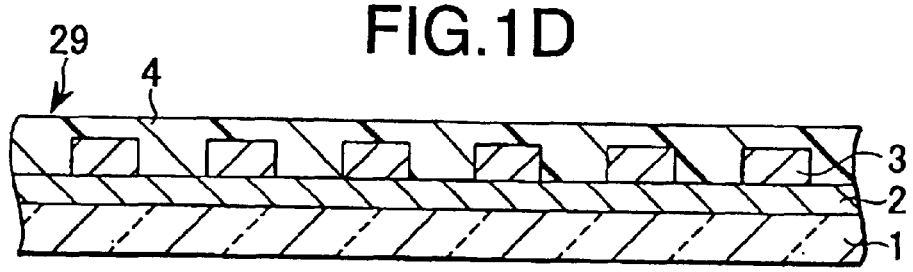

Next, as shown in FIG. 1D, an organic insulating resin such as an acrylic resin 4 is coated uniformly on the chip 3 and a gap therebetween. This coating can be attained easily by a spin coating or printing methods.

Figure 1E:
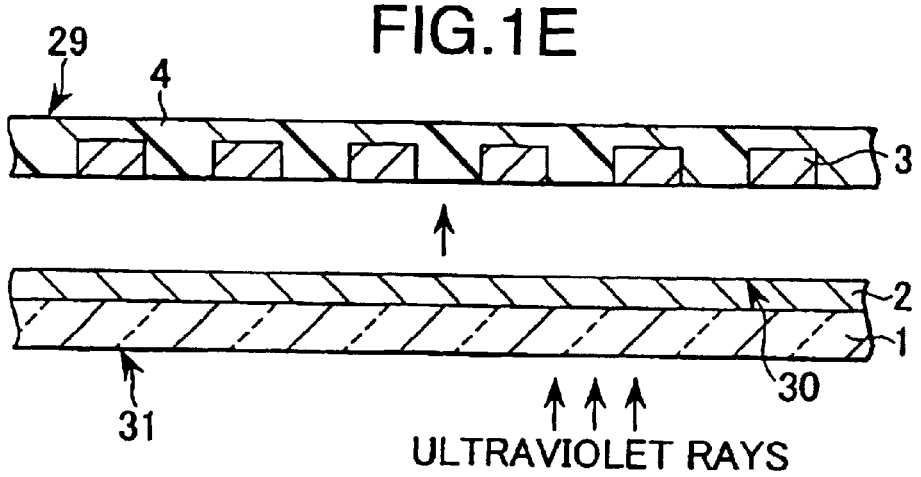

In the next step as shown in FIG. 1E, ultraviolet rays are irradiated from a bottom side 31 of the quartz substrate 1 so as to weaken the adhesive strength of the adhesive sheet, then a pseudo wafer 29 comprising a plurality of non-defective bare chips 3 which are bonded continuously on their side walls and bottom surfaces is peeled off from the quartz substrate 1 at an adhesive surface 30.

Figure 1F:
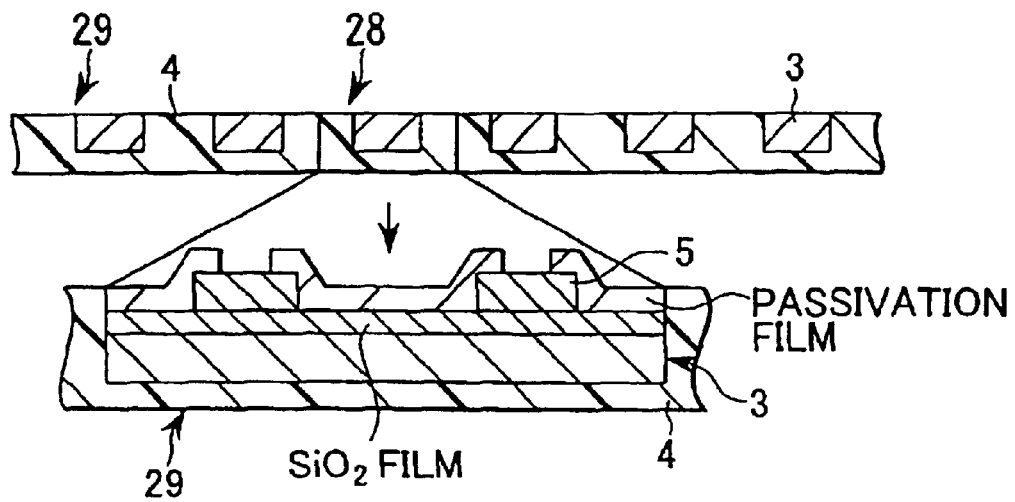

In the next step as shown in FIG. 1F, the pseudo wafer 29 is turned over so as to cause a non-defective bare chip's surface (device surface) 28 to face upward. The pseudo wafer 29 as partially enlarged in this figure has an Al electrode pad 5 and a passivation film formed on the silicon substrate via an $SiO_2$ film.

Figure 1G:
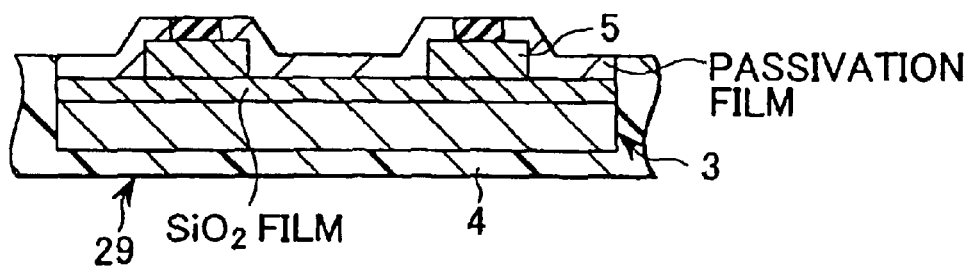
Figure 1H:
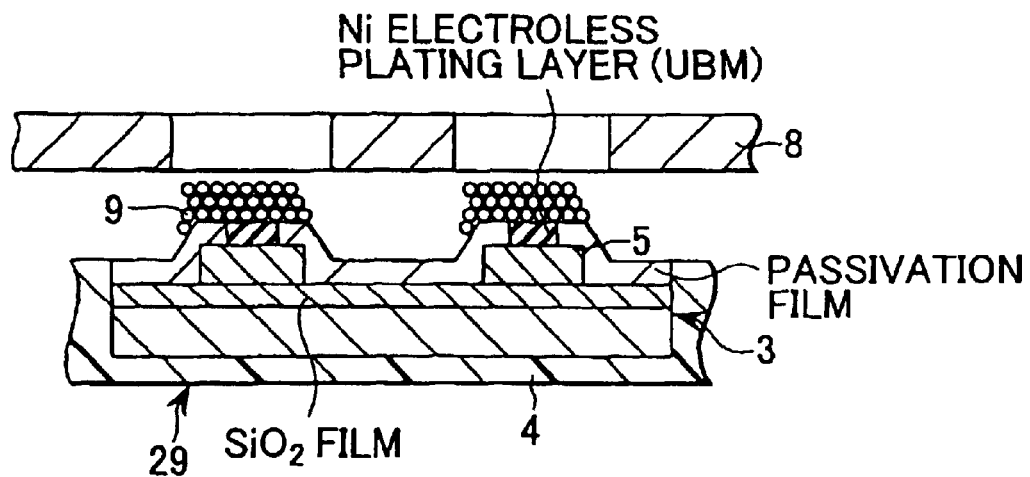
Figure 1I:
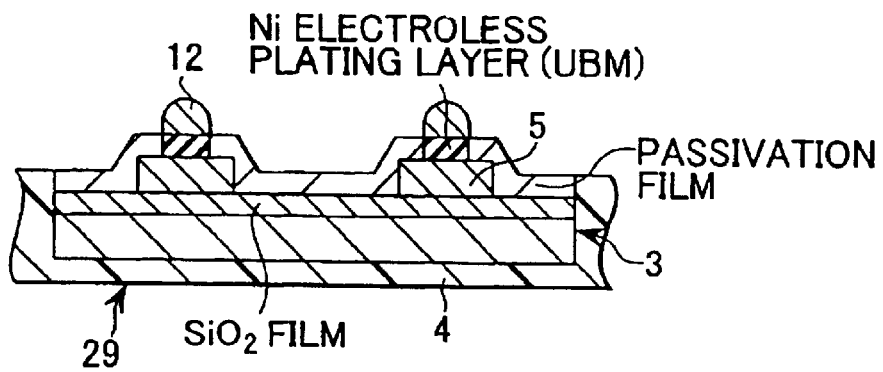
Figure 11A:
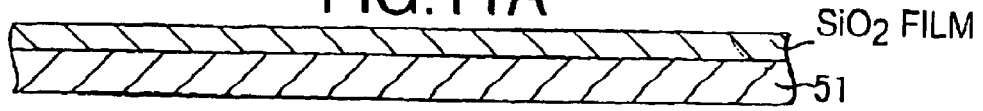
FIGS. 11A–11E are cross-sectional views showing a flow of steps of manufacture of the semiconductor chip according to the above.
Figure 11B:
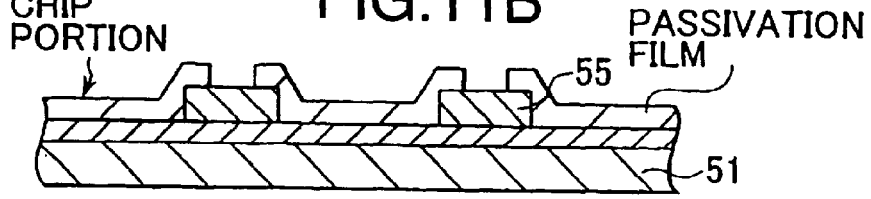
Figure 11C:
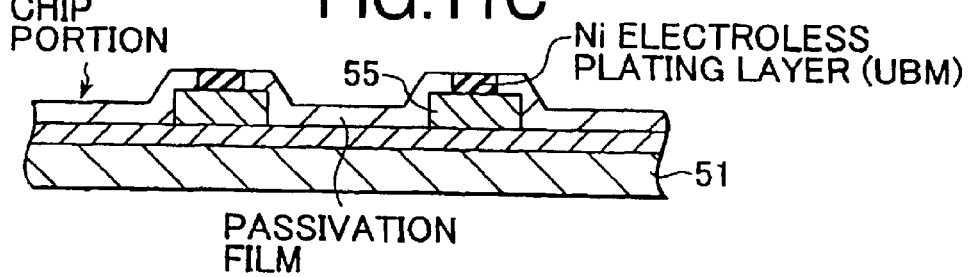
Figure 11D:
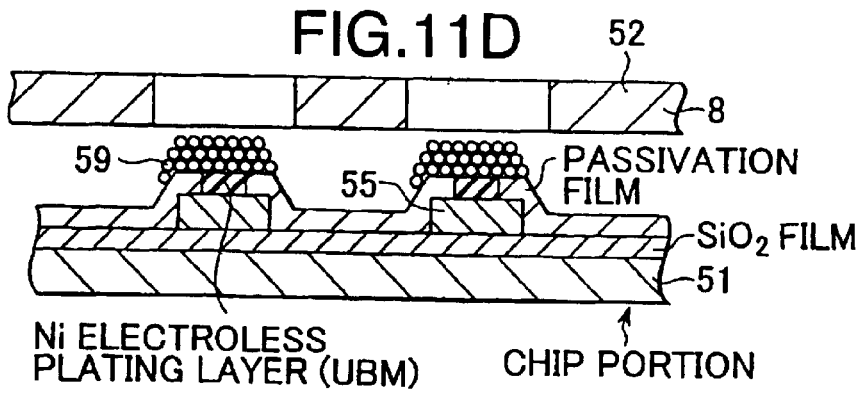
Figure 11E:
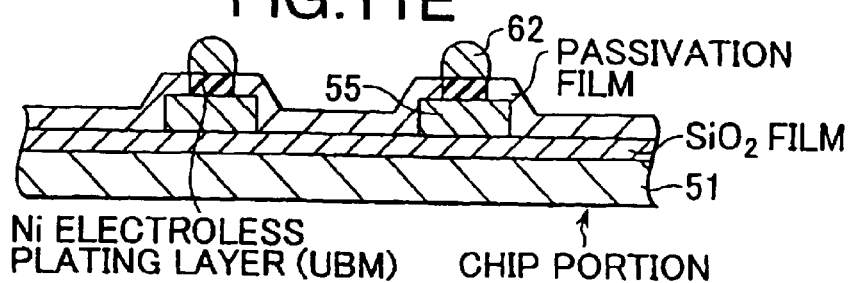
Figure 12A:
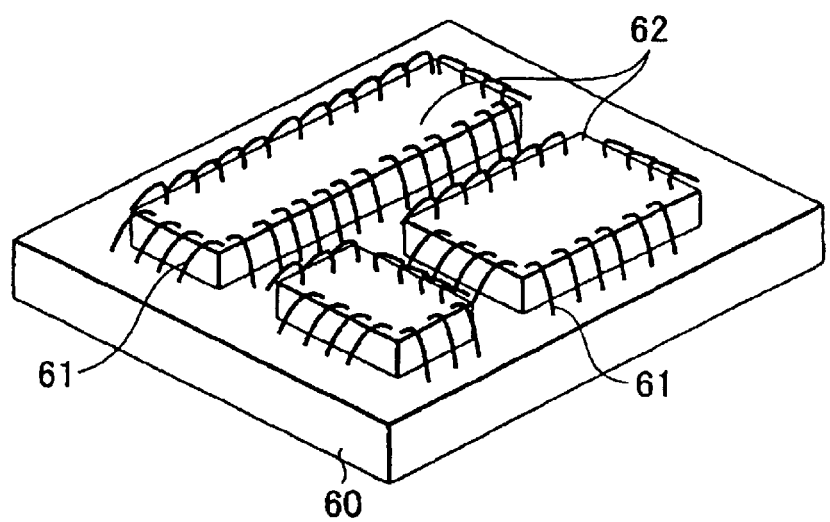
FIGS. 12A and 12B show a perspective view of an example of module structures packaged into an MCM (12A), and a side view of the same (12B).
Figure 12B:
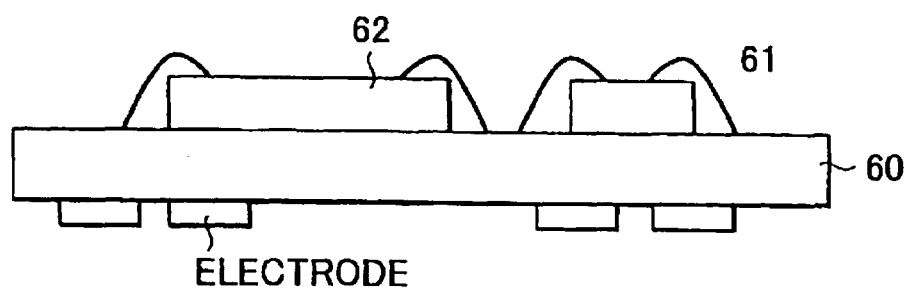
Figure 13A:
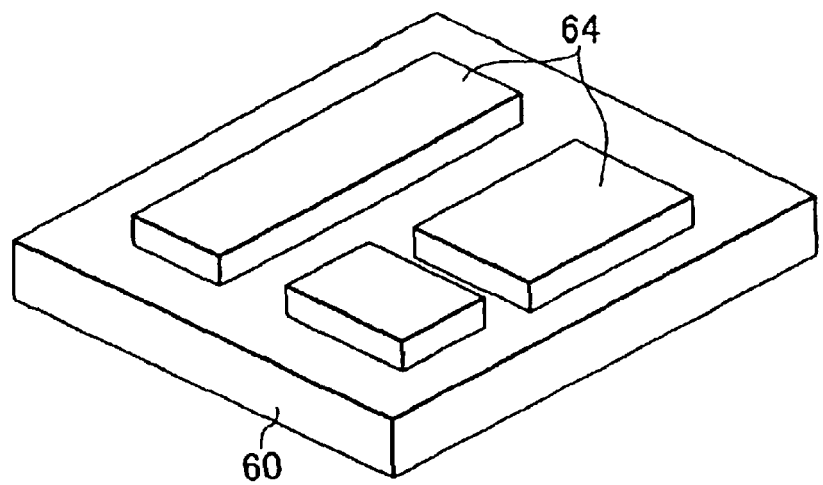
FIGS. 13A–13C show a perspective view of another example of module structures packaged into an MCM (13A), and side views of the same (13B and 13C).
Figure 13B:
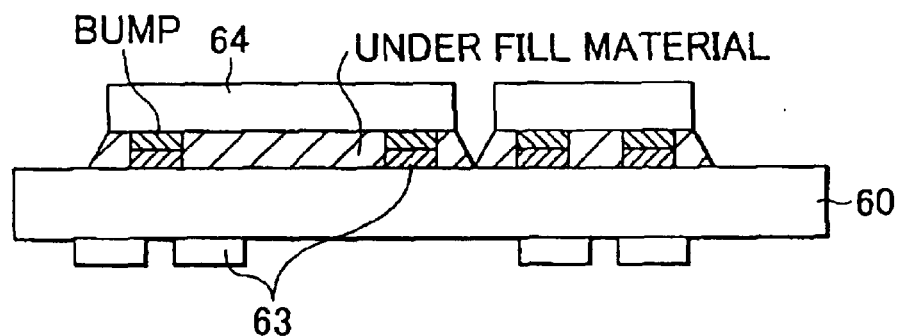
Figure 13C:
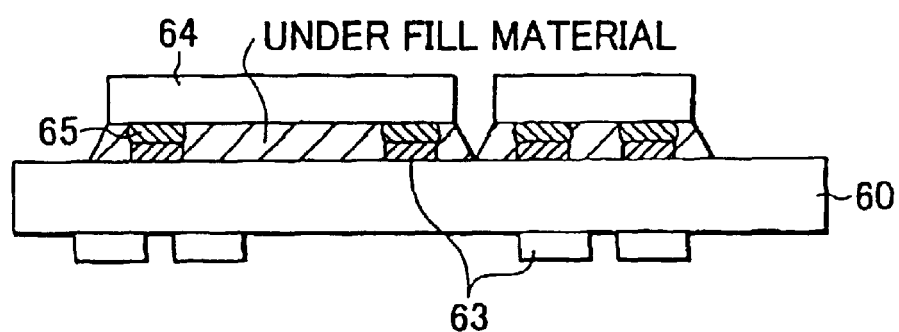

Then, as shown in FIGS. 1G–1I, the same steps of processing as already described with reference to FIGS. 11C–11E are applied. FIG. 1G shows an Ni electroless plating process to provide a UBM, FIG. 1H shows a print/transfer of a solder paste 9 using a print mask 8, and FIG. 1I shows a state of a solder bump 12 formed by a wet back method.

Namely, in the step of FIG. 1G, only on a surface of the Al electrode pad 5 which is opened, an Ni electroless plating layer (UBM) is formed selectively by the Ni electroless plating method. This Ni electroless plating layer (UBM) is easily formed by the steps of: pretreating the upper surface of the Al electrode pad 5 with a phosphoric acid etching solution; then precipitating Zn by a zinc substitution process; and dipping in an Ni—P plating vessel. This Ni electroless plating layer functions as a UBM (under bump metal) which facilitates electric connection between the Al electrode pad 5 and the solder bump.

FIG. 1H shows a state of a solder paste 9 which was transferred via the print mask 8 onto the Ni electroless plated layer (UBM) by the printing method. FIG. 1I shows a state in which the solder paste 9 is fused by the wet back method to form the solder bump 12. As described above, the solder bump 12 can be formed easily using the Ni electroless plating method and the solder paste screen printing method or the like, without need of using a photo process.

According to the steps of fabrication described above, even if the chips to be fabricated are leading-edge LSIs which normally have a low yield, or purchased from the other manufacturers, if totally and only non-defective chips 3 selected from among them are rearranged and pasted on the quartz substrate 1 to provide for a pseudo wafer 29 which is thus comprised, as if, totally of non-defective bare chips 3, a wafer batch bump forming becomes possible, thereby decreasing the fabrication cost substantially.

Further, in the step of FIG. 1I, by carrying out measurements of electrical characteristics of the non-defective chips by a probe inspection and/or a burn-in processing, a more precise selection only of the non-defective bare chips 3 which passed prior selection before the step of FIG. 1C will be ensured.

Figure 1J:
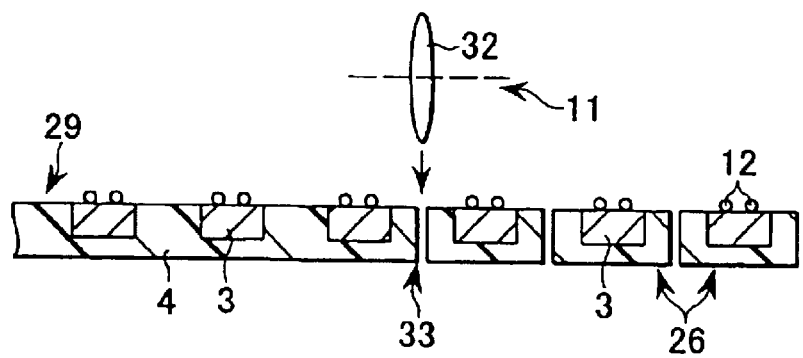

FIG. 1J shows a step of dicing the pseudo wafer 29 along a scribe line 33 with a blade 32 (or a laser beam) into discrete pieces of a non-defective chip component 26 which is comprised of the chip 3 which is protected and enforced by the resin 4.

Figure 1K:
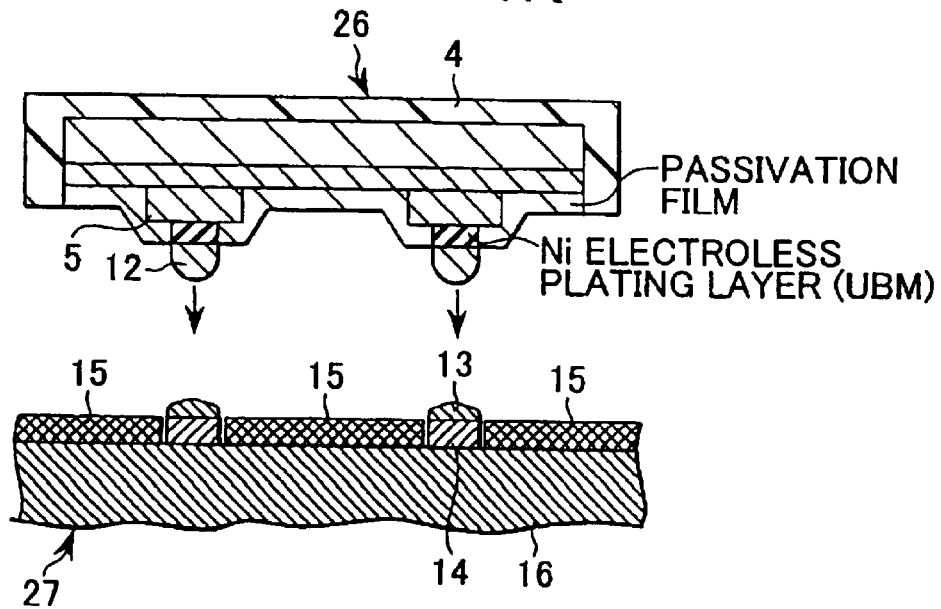

Then, as shown in FIG. 1K, the non-defective chip component 26 diced into a discrete piece is mounted on a package substrate 27 which is provided with an electrode 14 which is surrounded by a solder resist 15 on a wiring substrate 16, and covered with a solder paste 13.

In this instance, because the side wall and the bottom surface of the non-defective chip component 26 are covered with the resin 4, no damage direct to the non-defective chip component 26 occurs during an adsorption handling or the like when mounting the same on the packaging substrate 27. Therefore, a high reliability flip chip packaging is expected to be done.

The above description has been made by way of example of the flip chip packaging technique for packaging semiconductor chips, however, it is not limited thereto, and may be applied to an interconnection solder bump forming technique in a high density flip chip packaging and a method of fabrication thereof, wherein the non-defective bare chips 3 are arrayed at an equidistance and pasted on the quartz substrate 1 with their surfaces (device surface) 28 facing downward, then the resin 4 is coated uniformly on their bottom surfaces and therebetween thereby securing the non-defective chips 3 to be held firmly to each other.

By peeling off from the adhesive sheet 2, the pseudo wafer 29 on which only non-defective chips 3 are arrayed is provided, then a batch bump forming on this pseudo wafer 29 is carried out thereby allowing a low cost bump chip to be fabricated. This bump chip of the invention can be used not only in compact, lightweight and portable electronic devices, but also in any other types of electronic devices.

Figure 2:
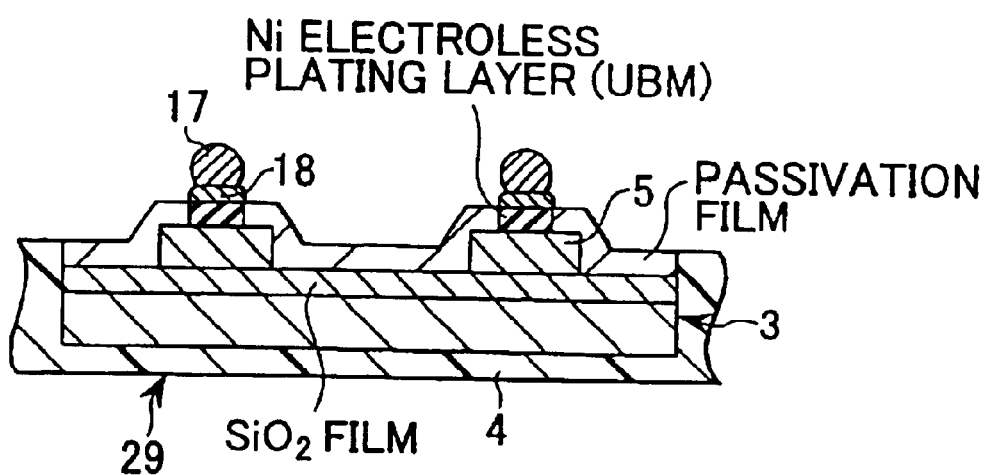
FIG. 2 is a cross-sectional view showing a pseudo wafer of the above using a metal ball instead of a solder paste.

FIG. 2 shows a modified type of the bump forming method in which a metal ball (solder ball) 17 is used in place of the above-mentioned solder paste 9.

Namely, a passivation film which covers the Al electrode pad 5 formed on the pseudo wafer is perforated at a position where a bump electrode is to be formed, and a Ni electroless plating layer (UBM) is formed therein.

Then, a flux 18 is coated on this Ni electroless plated layer (UBM) by a printing method or the like. A material suitable for this flux 18 preferably has a high adhesive strength so as to facilitate a transfer of a metal ball 17, and a quantity of this coating is sufficient if the metal ball 17 is retained. By way of example, although the method for coating the flux 18 is not limited to the printing method, however, in practice, the printing method is preferable. It is because that in comparison with the other methods, this method is advantageous in that it can coat the flux 18 in a preferred pattern in a simple and efficient operation.

Further, the metal ball 17 which is mounted on the flux 18 is subjected to a reflow (fusing) process, and then the flux 18 is cleaned. Thereby, the metal ball 17 is ensured to attach to the Ni electroless plating layer (UBM) very strongly, thereby completing the process of forming bump electrodes.

As described hereinabove, according to the first embodiment of the present invention, because that the non-defective semiconductor chips diced from the wafer are rearranged and pasted on the substrate at the equidistance, then after coating with the resin, the pseudo wafer as if having totally and only the non-defective semiconductor chips is obtained. Therefore, the wafer batch processing for forming solder bumps on the plurality of the non-defective chips becomes possible, thereby enabling a chip having flip chip solder bumps to be formed at a low cost. Further, not only the wafers of the in-house product but also bare chips purchased from the other manufacturers can be processed alike to form solder bumps thereon easily according to the invention.

Still further, because that the side walls and the bottom surfaces of respective chips are covered with the resin and protected thereby, even the Ni electroless plating process becomes possible, and thus an excellent package reliability is ensured even in a package handling of respective chips after diced into discrete chips. Because the substrate used for pasting non-defective chips can be used repeatedly after peeling the pseudo wafer, it is advantageous for cost reduction of the bump forming and environmental protection.

Furthermore, the merit and the advantage of the low cost bump processing based on the wafer batch processing method of the invention can be utilized in processing of the leading-edge LSIs or bare chips purchased from the other manufacturer, thereby providing a novel bump forming method widely applicable. In addition, when dicing respective semiconductor chips from the pseudo wafer after treatment, because they are cut along the scribe line at the position of the resin between respective chips, the dicing is carried out easily without damaging the cutter blade and minimizing adverse effects (strain, flash, crack and the like damages) on the body of the semiconductor chips.

Figure 5A:
FIGS. 5A–5J are cross-sectional views showing a flow of steps of manufacture of a semiconductor chip for use in an MCM according to a second embodiment of the invention.
Figure 5B:
Figure 5C:
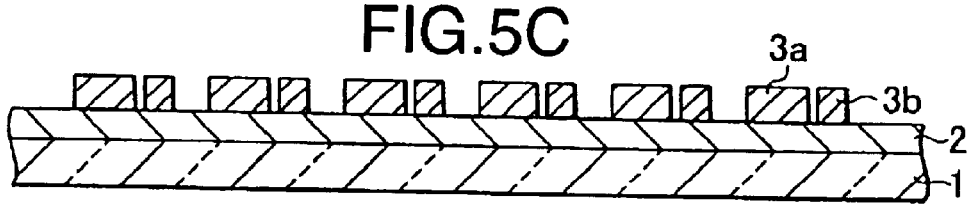
Figure 5D:
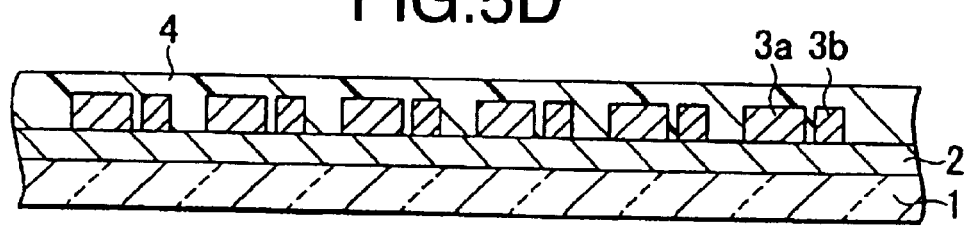
Figure 5E:
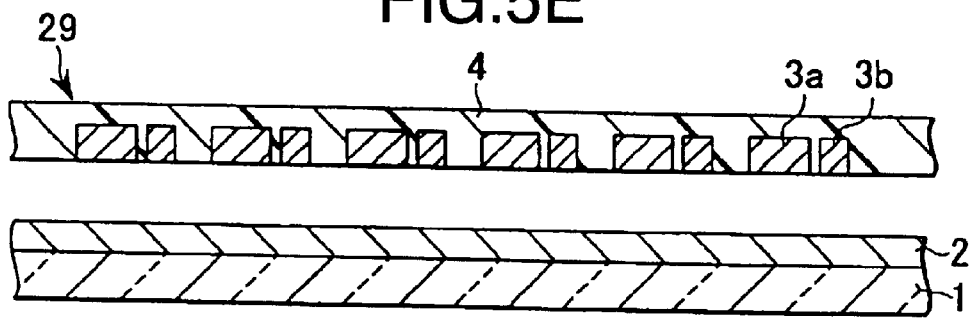
Figure 5F:
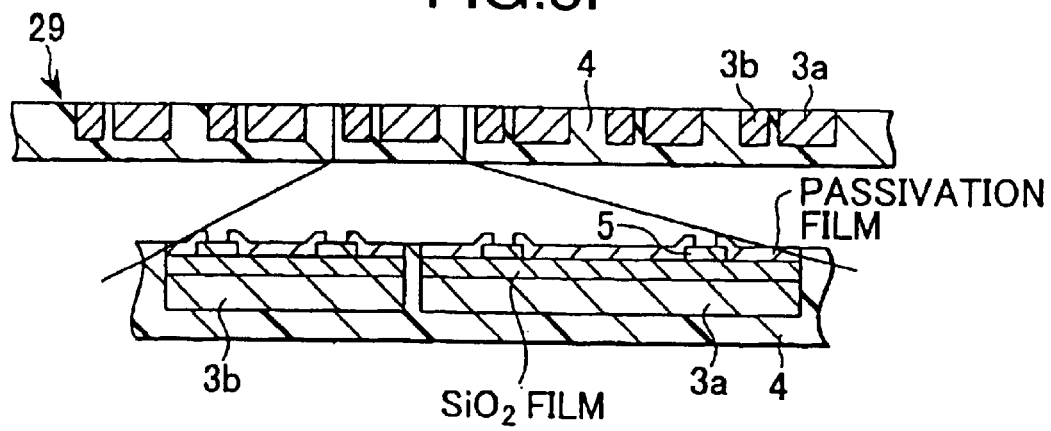
Figure 5G:
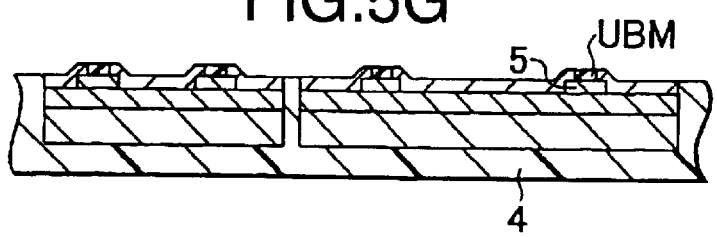
Figure 5H:
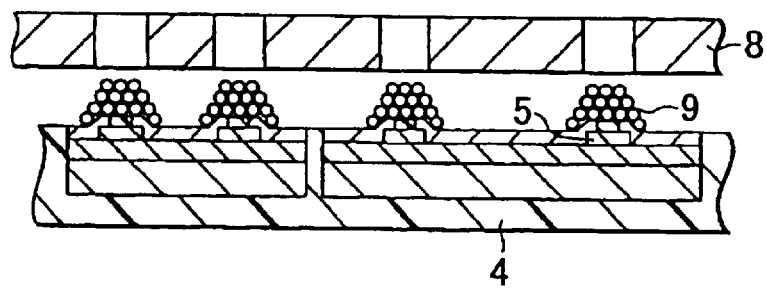
Figure 5I:
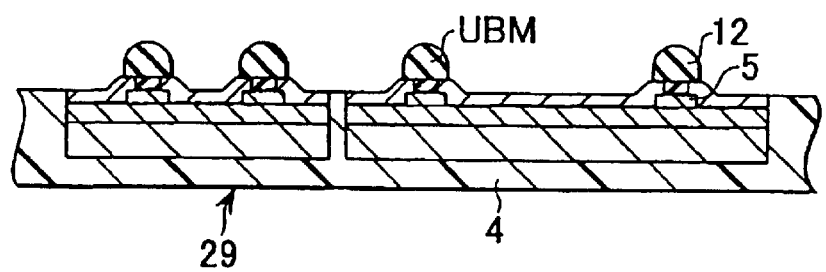
Figure 5J:
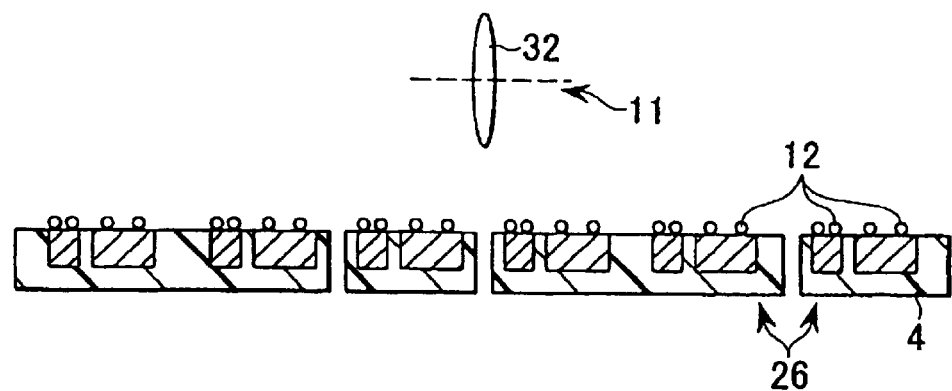
Figure 6:
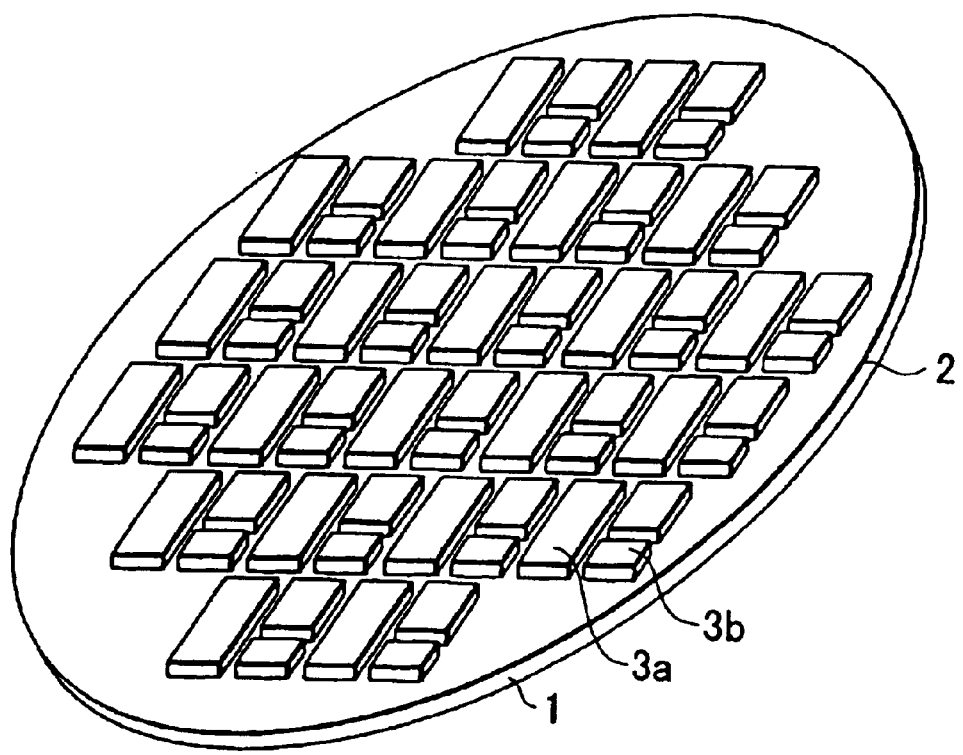
FIG. 6 is a perspective view-of a quartz substrate having solely and only non-defective chips pasted thereon.
Figure 7:
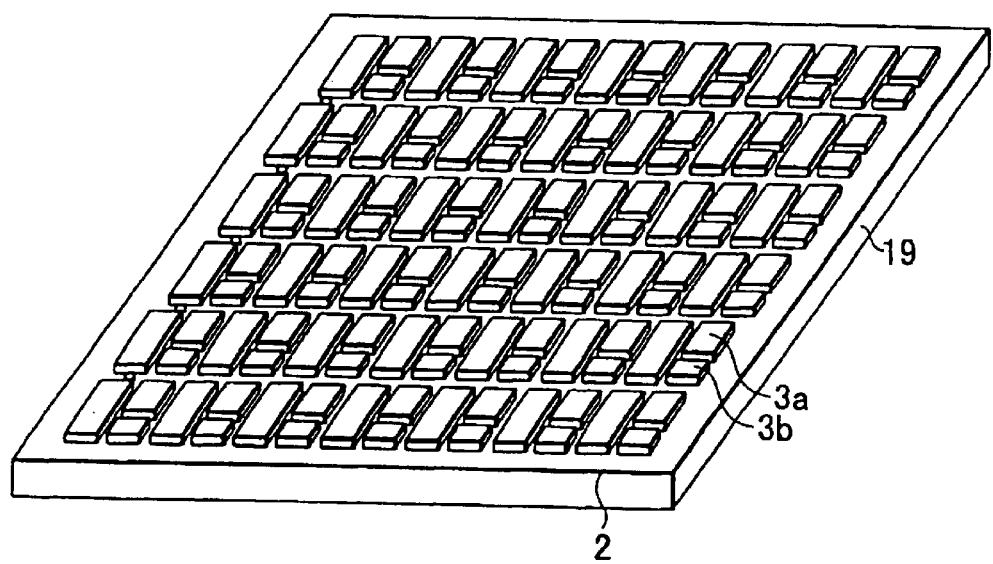
FIG. 7 is a perspective view of a large-scaled glass substrate having solely non-defective chips pasted thereon.

Embodiment 2:

FIGS. 5–7 show a second embodiment of the present invention for obtaining chip-like electronic components each packaged in an MCM (multi chip module) comprising a plurality of different types of non-defective chips.

Namely, FIGS. 5A–5J correspond respectively to FIGS. 1A–1J of the first embodiment described hereinabove, wherein the same components with the same reference numerals are omitted of their explanations, and the process of FIG. 1K is executed in the same manner also in this second embodiment.

According to the second embodiment, in the step of FIG. 5C, as the semiconductor chips 3, a plurality of different types of semiconductor chips 3a and 3b are pasted on the quartz substrate 1, then they are treated in the same manner as described in the first embodiment. However, as shown in FIG. 5J, the plurality of different types of semiconductor chips 3a and 3b are scribed into various patterns of combinations thereof, and diced into non-defective chip-like components 26 for providing MCMs.

FIG. 6 shows an example of equidistantly re-arranged plurality of different types of semiconductor chips 3a and 3b (or LSI chips) which are diced from the semiconductor wafer, verified to be conforming (non-defective) in an open/short-circuited or DC voltage measurements, and pasted on a circular quartz substrate 1 via the adhesive sheet 2 made of acrylic or the like. FIG. 7 shows another example of the above in which a greater number of non-defective chips 3 are pasted via the adhesive sheet 2 on a larger-sized square glass substrate 19 which is used in place of the circular quartz substrate 1 so as to allow for the greater number of non-defective chips to be pasted on a limited area, thereby allowing for an increased cost merit to be attained in the subsequent processing.

The same advantages and effects as in the first embodiment are obtained according to the second embodiment as well, and this embodiment is confirmed suitable for provision of the MCMs.

Embodiment 3:

With reference to FIGS. 8A–8G, a third embodiment of the present invention is described, in which a SOG (spin on glass) film 4' which consists of an inorganic insulating material such as $SiO_x$ is used instead of the resin 4 used in the first embodiment for embedding the non-defective chips 3, then after-heating or the like, a pseudo wafer 29 for use in fabrication of MCMs is peeled off.

Figure 8A:
FIGS. 8A–8G are cross-sectional views showing a flow of steps of manufacture of a wafer for use in the MCM according to a third embodiment of the invention.

Namely, FIG. 8A depicts a substrate 1' which serves as a temporary support substrate. However, the substrate 1' used here is not limited to the above-mentioned quartz substrate or the glass substrate, but other non-transparent substrates such as Si or a metal plate may be used alike.

Figure 8B:

Then, as shown in FIG. 8B, an adhesive sheet 2' made of, for example, acrylic, which is used in normal dicing and has a property to lose its adhesive strength when subjected to a chemical solution or heating is pasted on the substrate 1'.

Figure 8C:
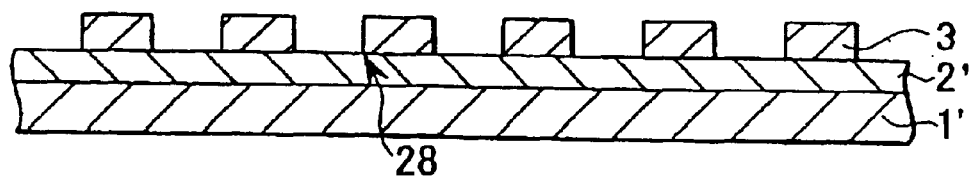

Further, as shown in FIG. 8C, a plurality of semiconductor bare chips 3 which are confirmed to be non-defective and conforming as described hereinabove are arrayed and pasted on the adhesive sheet 2' with their chip surfaces (device surfaces) 28 facing downward. By way of example, the plurality of non-defective bare chips 3 used here may be selected directly from an extended dicing sheet (not shown) used in dicing in the normal wafer process as shown in FIG. 14, or may be transferred from a chip tray. What is important and should be note here is that notwithstanding whether they are in-house products or those purchased from outside, totally and only the non-defective or conforming bare chips 3 are allowed to be rearranged on the substrate 1.

Preferably, this non-defective chip 3 is specially designed suitable for a multi chip module packaging. Further, preferably, the same has a small pad (approximately ≦20 nm□) for inter-chip wiring, and a test pad for testing each chip.

Figure 8D:
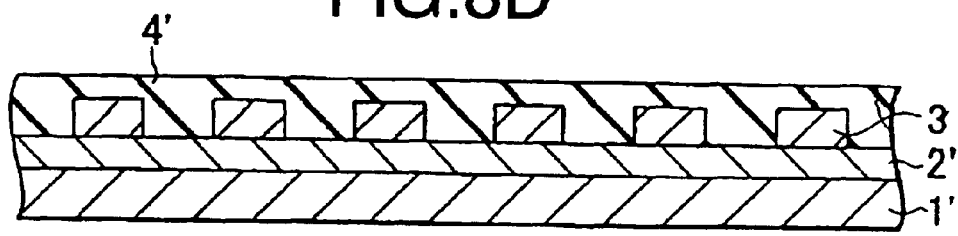

In the next step of FIG. 8D, the insulating material 4' such as SOG or the like is coated from above the chips 3 thereby embedding the chips 3.

Figure 8E:
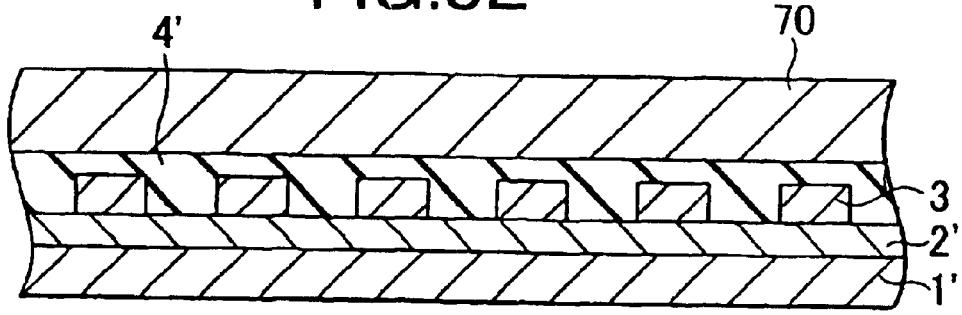
Figure 8F:
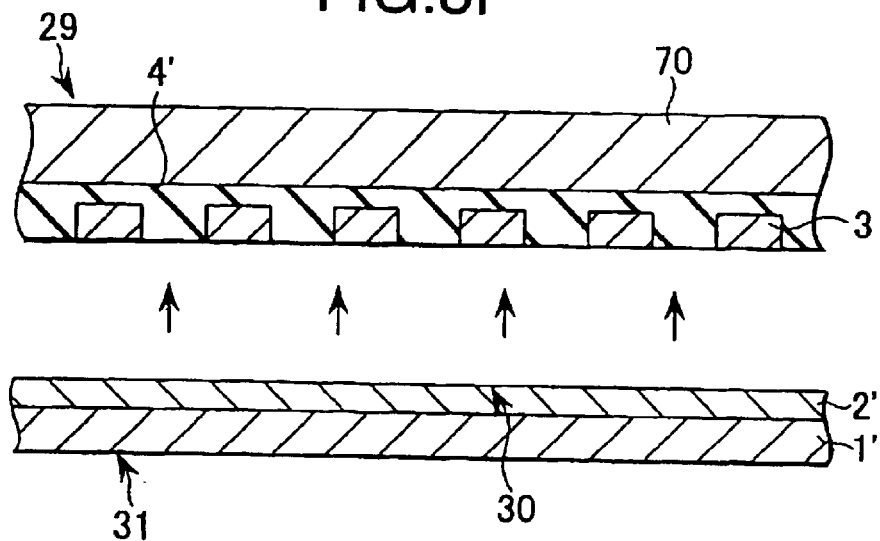

Then, in the step of FIG. 8E, after bonding a Si wafer 70 on the insulating material 4', the adhesive strength of the adhesive sheet 2' is weakened by applying a chemical solution or heating so as to allow for both of the Si wafer 70 and the embedded chips 3 firmly retained by the adhesive strength of the insulating material 4' to be removed from the substrate 1' as depicted in FIG. 8F.

Through these steps of processing described hereinabove, a plurality of module chips 3 having a uniform level of surface height are ensured to be bonded on the Si wafer 70. Subsequently, re-wiring between the chips 3 is carried out in the normal wafer process as indicated in FIG. 8G.

Thereby, a problem associated with the conventional technique of rewiring between respective module chips resulting from a difference in heights of chips is solved by provision of the flattened wiring surfaces of the chips according to the invention, thereby allowing the rewiring therebetween to be accomplished for sure. Namely, in the conventional MCM packaging technique in which the semiconductor or LSI chips are mounted on the Si wafer and rewired therebetween, there was a problem due to variations in film thickness between respective module chips, and actually it has been difficult to adopt a method of rewiring which utilizes any of the preceding steps of handling. However, according to the embodiments of the invention, it is enabled to paste the plurality of chips 3 on the Si wafer with their surface heights leveled uniformly in a horizontal direction without need of consideration of the variations in the film thickness of respective module chips, thereby substantially simplifying and facilitating the rewiring process of the MCMs.

Figure 8G:
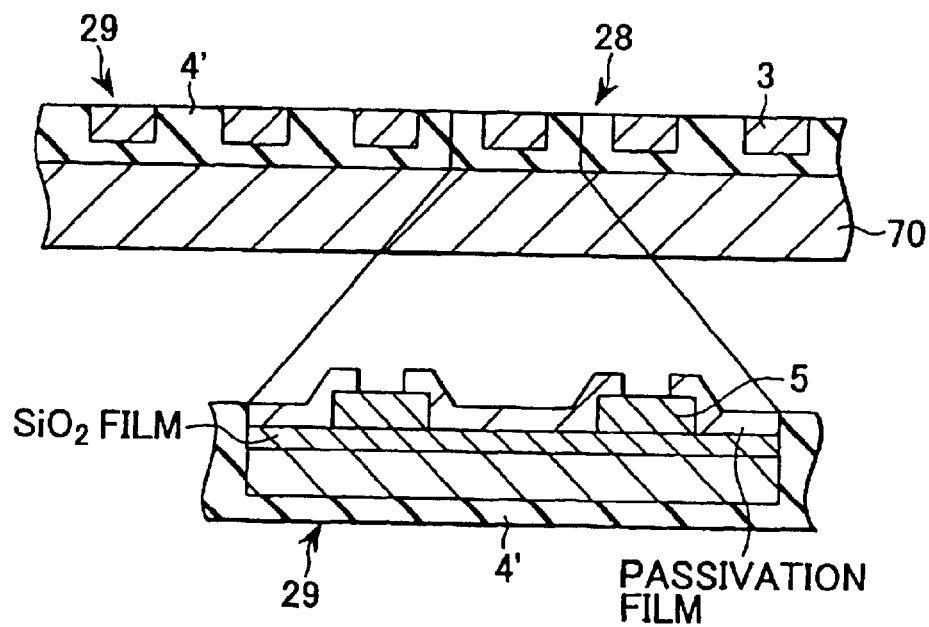
Figure 9:
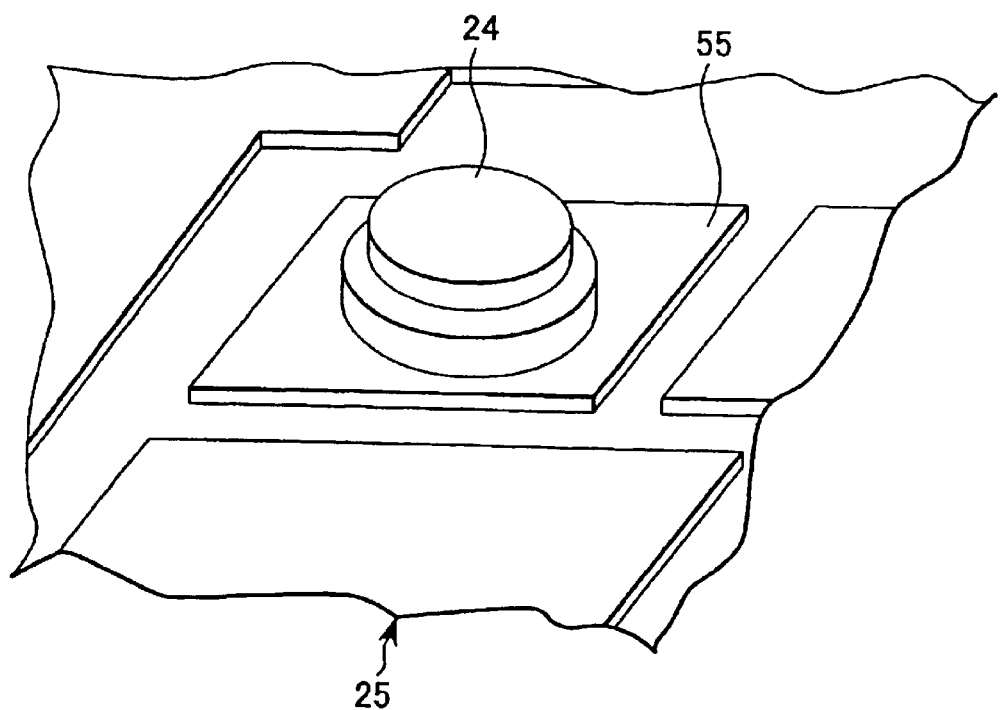
FIG. 9 is a perspective view of an example of conventional Au stud bumps.
Figure 10:
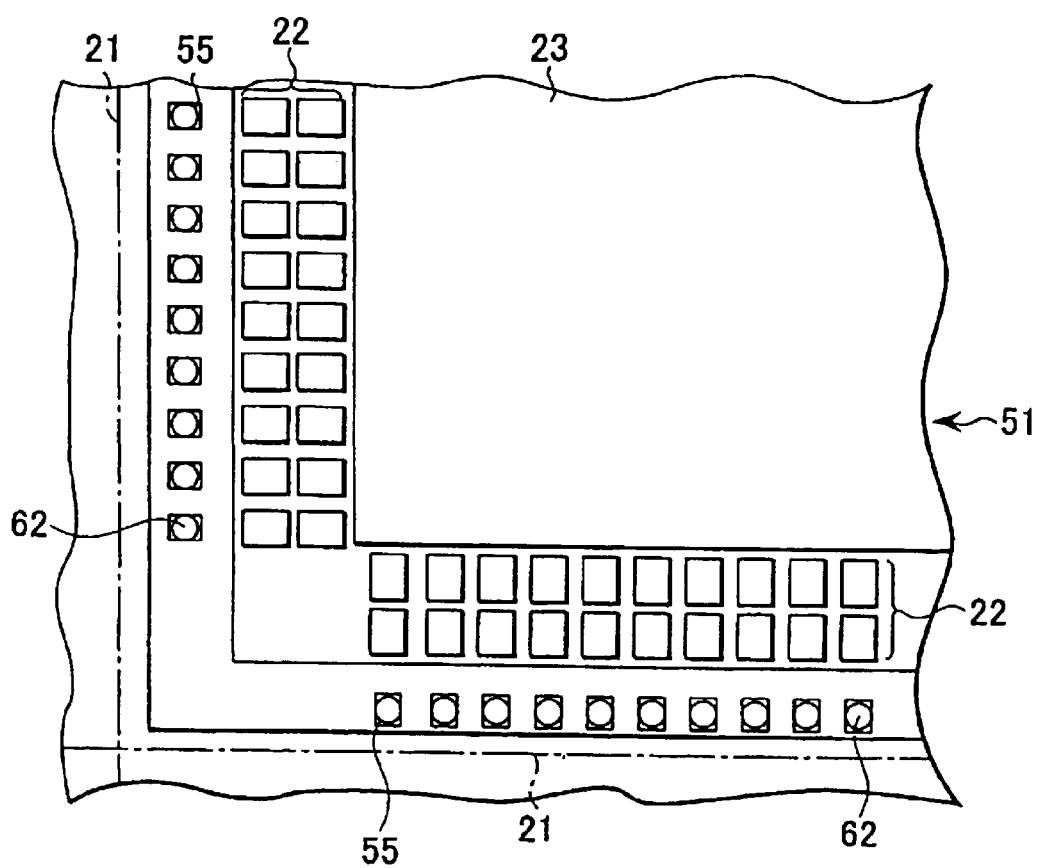
FIG. 10 is a plan view in part of a semiconductor wafer subjected to a batch solder bump treatment in a stage of its wafer level.

Further, after the step of FIG. 8G, the packaging process may proceed in the same flow of steps as indicated in FIGS. 1I–1K.

The present invention is not limited to the preferred embodiments described above, and many other modification can be contemplated within the scope of the invention.

For example, the substrate on which the non-defective bare chips are to be pasted may be comprised of any other materials instead of the quartz or glass if it has the same function and strength. Further, the shape and thickness of its substrate can be modified at discretion. Also, various types of acrylic or other materials may be used as the adhesive sheets 2 and 2' if it has the same function. Materials for the resin 4 and insulating material 4' may be selected from the group consisting of the similar materials. In addition, the distance between the plurality of non-defective bare chips 3 at which they are arrayed may be selected at discrete if it is equidistant.

Further, the substrate such as the quartz substrate 1 described heretofore can be used repeatedly thereby providing substantial advantages in cost merits and environmental protection. Still further, the object of application of the invention is not limited to the semiconductor chips described hereinabove, but is also applicable to any other chip-like electronic components which involve the process of dicing into discrete chips during its fabrication.

What is claimed is:

1. A method of manufacturing a chip-like electronic component, comprising the steps of:

pasting an adhesive material on a substrate, said adhesive material having a property to retain an adhesive strength prior to a weakening process and to lose said adhesive strength after said weakening process;

fixing a plurality of similar and/or different types of non-defective semiconductor chips on said adhesive material with an electrode surface thereof facing down, the electrode surface of the chips being in direct contact with the adhesive material;

coating a whole area including said plurality of non-defective semiconductor chips and interspaces therebetween with a protective material, wherein the step of coating is performed prior to forming electrical connections to electrodes of said semiconductor chips;

applying a weakening process to said adhesive material to weaken said adhesive strength of said adhesive material so as to peel off a pseudo wafer which bonds said plurality of non-defective semiconductor chips as covered with said protective material; and thereafter performing processing of said pseudo-wafer to form electrical connections with electrodes of the chips in the pseudo-wafer;

dicing said plurality of similar and/or different types of semiconductor chips by cutting said protective material in said interspaces therebetween.

2. The method of manufacturing chip-like electronic components according to claim 1, wherein:

said substrate has a flat surface;

said adhesive material is an adhesive sheet;

said protective material is either one of an organic insulating resin and an inorganic insulating material and is uniformly coated on said plurality of semiconductor chips;

said weakening process includes irradiating ultraviolet rays on said adhesive sheet through said flat substrate from a bottom surface thereof opposite to the surface bonding of said plurality of semiconductor chips, or applying a chemical solution or heating the same to weaken said adhesive strength of said adhesive sheet so as to peel off a pseudo wafer having said plurality of similar and/or different types of semiconductor chips bonded thereon as covered with said protective material, from said flat substrate, thereby obtaining said pseudo wafer, wherein said plurality of semiconductor chips which are non-defective (conforming) are arrayed thereon with their electrode surfaces exposed; and dicing said pseudo wafer between said plurality of semiconductor chips.

3. The method of manufacturing the chip-like electronic components according to claim 1, wherein:

said pseudo wafer is diced at a position of said protective material between said plurality of semiconductor chips; and a discrete semiconductor chip or an integrated chip integrating a plural number of similar and/or different types of semiconductor chips is obtained.

4. The method of manufacturing the chip-like electronic components according to claim 3, wherein one or more solder bumps are formed secured to said electrodes.

5. The method of manufacturing the chip-like electronic components according to claim 1, wherein said plurality of semiconductor chips which are determined to be non-defective in a characteristic measurement thereof are fixed firmly on said substrate.

6. The method of manufacturing the chip-like electronic components according to claim 1, further comprising the steps of:

carrying out a characteristic measurement of said plurality of semiconductor chips in a state firmly fixed thereon and bonded with said protective material; and selecting non-defective semiconductor chips or non-defective chip-like electronic components.

7. A method of manufacturing a pseudo wafer comprising the steps of:

pasting an adhesive material on a substrate, said material having a property to retain an adhesive strength prior to a weakening process and lose said adhesive strength after said weakening process;

fixing on said adhesive material a plurality of similar and/or different types of non-defective semiconductor chips with their electrode surfaces facing down, the electrode surface of the chips being in direct contact with the adhesive material;

coating with a protective material a whole area of said plurality of non-defective semiconductor chips including interspaces therebetween, wherein the step of coating is performed prior to forming electrical connections to electrodes of said semiconductor chips;

applying a weakening process to said adhesive material so as to lose its adhesive strength;

thereafter performing processing of said pseudo-wafer to form electrical connections with electrodes of the chips in the pseudo-wafer; and peeling off a pseudo wafer having said plurality of semiconductor chips fixed thereon.

8. The method of manufacturing said pseudo wafer according to claim 7, wherein:

said substrate has a flat surface;

said adhesive material is an adhesive;

said protective material is either one of an organic insulating resin and an inorganic insulating material and in uniformly coated on said semiconductor chips;

said weakening process includes irradiating ultraviolet rays, through said substrate from a surface opposite to the surface thereof fixing said plurality of semiconductor chips thereon, or applying a chemical solution thereto or heating said adhesive sheet to weaken the adhesive strength of said adhesive sheet so as to peel off a pseudo wafer having said plurality of semiconductor chips bonded with said protective material from said substrate.

9. The method of manufacturing the pseudo wafer according to claim 7, wherein one or more solder bumps are formed secured to said electrodes.

10. The method of manufacturing the pseudo wafer according to claim 7, wherein said semiconductor chips which are determined to be non-defective in characteristic measurements thereof are fixed on said substrate.

11. The method of manufacturing the pseudo wafer according to claim 7, further comprising the steps of:

carrying out characteristic measurements of said semiconductor chips in a state as bonded with said protective material; and selecting non-defective semiconductor chips or non-defective chip-like electronic components.

* * * * *